(12) United States Patent
Holube et al.

(10) Patent No.: US 6,198,830 B1
(45) Date of Patent: Mar. 6, 2001

(54) METHOD AND CIRCUIT FOR THE AMPLIFICATION OF INPUT SIGNALS OF A HEARING AID

(75) Inventors: Inga Holube, Erlangen; Volker Hohmann; Birger Kollmeier, both of Oldenburg, all of (DE)

(73) Assignee: Siemens Audiologische Technik GmbH, Erlangen (DE)

( * ) Notice: Subject to any disclaimer, the term of this patent is extended or adjusted under 35 U.S.C. 154(b) by 0 days.

(21) Appl. No.: 09/015,316

(22) Filed: Jan. 29, 1998

(30) Foreign Application Priority Data

Jan. 29, 1997 (DE) .............................. 197 03 228

(51) Int. Cl.$^7$ .................................................. H04R 25/00
(52) U.S. Cl. ...................... 381/321; 381/312; 381/317; 381/370; 455/232.1; 455/234.2
(58) Field of Search .................... 381/312, 320, 381/321, 317, 13; 455/232.1, 234.1, 234.2

(56) References Cited

U.S. PATENT DOCUMENTS

| | | | |
|---|---|---|---|
| 3,993,862 | * 11/1976 | Karr | 178/6 |
| 4,536,844 | * 8/1985 | Lyon | 364/487 |
| 4,837,830 | * 6/1989 | Wrench, Jr. et al. | 381/42 |
| 5,054,085 | * 10/1991 | Meisel et al. | 381/43 |
| 5,381,512 | * 1/1995 | Holton et al. | 395/2.41 |
| 5,717,818 | * 2/1998 | Nejime et al. | 395/2.2 |
| 5,729,145 | * 3/1998 | Blades | 324/536 |
| 5,757,932 | * 5/1998 | Lindemann et al. | 381/313 |
| 5,812,678 | * 9/1998 | Scalise et al. | 381/67 |
| 5,862,238 | * 1/1999 | Agnew et al. | 381/321 |
| 5,892,836 | * 4/1999 | Ishige | 381/316 |
| 5,903,655 | * 5/1999 | Salmi et al. | 381/321 |

FOREIGN PATENT DOCUMENTS

| | | |
|---|---|---|
| 37 33 983 | 4/1989 | (DE) . |
| 0 252 205 | 1/1988 | (EP) . |
| WO 89/04583 | 5/1989 | (WO) . |
| WO 93/00779 | 1/1993 | (WO) . |

OTHER PUBLICATIONS

"Real–Time Multiband Dynamic Compression and Noise Reduction for Binaural Hearing Aids," Kollmeier et al., J. of Rehab. Res. and Dev., vol. 30, no. 1, (1993) pp 82–94.

"Ein tragbares Signalprozessor–System zur Evaluierung digitaler Hörgeräte–Algorithmen," Raβ et al., Audiologische Akustik, vol. 3 (1995) pp. 126–132.

Vergleich verschiedener digital realisierter Signalverarbeitungsstrategien für Dreikanal–Hörgeräte mit Dynamikkompression, Appell et al. Audiologische Akustik, vol. 3 (1995) pp. 134–143.

* cited by examiner

Primary Examiner—Curtis A. Kuntz
Assistant Examiner—Dionne Harvey
(74) Attorney, Agent, or Firm—Schiff Hardin & Waite

(57) ABSTRACT

In a method and circuit for the amplification of input signals of a hearing aid, a compression of the signals picked up by the hearing aid ensues in a AGC circuit dependent on the acquirable signal level. For assuring a dynamics compression, the method and circuit implement a signal analysis for the recognition of the acoustic situation in addition to the acquisition of the signal level of the input signal, and the behavior of the dynamics compression is adaptively varied on the basis of the result of the signal analysis. A fixed input-output characteristic that is usually defined on the basis of stationary signals forms the basis of parameter settings of a dynamics compression has been used in conventional calculations. The resulting time behavior for the compensation of input signals by a hearing aid exhibits an effectively different compression given time-variable, modulated signals, particularly given speech. The result is that the compression parameters are not optimally set for all signals. This result is avoided in the method and circuit described herein.

20 Claims, 2 Drawing Sheets

METHOD AND CIRCUIT FOR THE AMPLIFICATION OF INPUT SIGNALS OF A HEARING AID

BACKGROUND OF THE INVENTION

1. Field of the Invention

The present invention is directed to a method for the amplification of input signals of a hearing aid, wherein a compression of the signals picked up by the hearing aid ensues dependent of the acquirable signal level. The present invention is also directed to a circuit for the implementation of the aforementioned method.

2. Description of the Prior Art

There is usually an impaired sensitivity to volume given a hearing disorder of the inner ear. Soft signals are usually not perceived and must therefore be correspondingly amplified in the hearing aid, but loud signals are heard just as loud as in the case of normal hearing. Compression circuits are employed in hearing aids in order to adapt the amplification of the signals to the auditory sensation of a person with normal hearing. Such compression circuits contain an AGC (Automatic Gain Control) circuit that varies the amplification dependent on the signal level. Such AGC circuits have either an exactly defined behavior or can be modified by parameter settings (for example, compression ratio, cut-in point of the compression, time constant). These settings are determined in the individual adjustment of the hearing aid to the hearing-impaired person and are usually not changed during use of the hearing aid. Known compression algorithms implement either a level-limiting compression or a "full dynamic range" compression. In the level-limiting compression, the cut-in point of the compression usually lies at a relatively high level, at which level the signals are significantly compressed (high compression ratio). As a result, loud signals are prevented from being too highly amplified. In "full dynamic range compression", by contrast, the cut-in point of the compression usually lies as low as possible, with the compression ratio being selected such that the loudness sensed by the hearing-impaired person is balanced over the entire level range. An input-output characteristic that is based on stationary signals forms the basis for known techniques for calculating the parameter settings of a dynamics compression. Particularly in the employment of a loudness scaling, the sensed loudness is determined for stationary signals and the required compensation by the hearing aid is calculated therefrom. Given chronologically variable, modulated signals, i.e., speech, however, the time behavior of the compression circuit leads to an effectively different compression behavior. As a result the loudness perceived by the hearing-impaired person cannot be optimally compensated for all signals.

SUMMARY OF THE INVENTION

An object of the present invention is to provide a method and circuit of the type initially described with which an optimum dynamics compression can also be achieved given chronologically variable, modulated signals.

This object is achieved in the inventive method and circuit by assuring a dynamics compression conducting, a signal analysis in addition to the acquisition of the signal level, and the behavior of the dynamics compression is varied on the basis of the result of the signal analysis.

The invention makes it possible to implement an optimum dynamics compression for all conceivable noise/auditory situations without having to switch between various parameter settings with a program switch. The variable dynamics compression ensues automatically dependent on the result of the signal analysis of the input signals. The invention assures a simpler manipulation of the hearing aid by the hearing-impaired person and a saving of switches as well as, further, an improvement of the speech comprehension. Given speech signals overlaid with unwanted noise, further, the subjectively perceived noisiness can be reduced. The satisfaction of the hearing aid wearers can be significantly increased as a result and the length of time the hearing aids are worn can be effectively lengthened.

The signal analysis preferably ensues as a modulation frequency analysis of the input signal. The time variation of the envelope of the input signal is thereby spectrally analyzed.

The variation of the dynamics compression on the basis of the result of the signal analysis can ensue in various ways. The variation of the dynamics compression can be accomplished by modifying the time constant in the acquisition of the level of the input signal, i.e. the time constant in the level detector, or by variation of the compression ratio of the amplification element, particularly AGC amplification element.

Both of the above possibilities for variation can be simultaneously utilized. For example, long time constants and/or high compression ratios can be utilized given low modulation frequencies, for example given slowly varying signals. When high modulation frequencies occur, for example given rapidly varying signals, by contrast short time constants and/or smaller compression ratios can be employed. Other combinations of time constants and compression ratios can be applied.

Moreover, the cut-in point of the compression after the signal analysis has ensued can be utilized for the variation of the dynamics compression.

According to a further embodiment of the present invention, the input signals are resolved into a number N of frequency bands and individual signal analyses are undertaken referenced to each frequency band. Subsequently, the frequency bands are merged after the amplification. As a result, the entire frequency spectrum can be sampled and optimally edited for the dynamics compression.

There is also the possibility of selectively amplifying certain frequency bands, or signal frequencies occurring therein, in a "customized" manner. There is also the possibility of combining individual frequency bands for the signal analysis and/or for the implementation of the dynamics compression. Alternatively, the signal analysis can be limited to one frequency band, with the control of the AGC parameters in all frequency bands ensuing on the basis of this signal analysis.

The invention also allows a suppression of unwanted noise to be undertaken by implementing a partial band analysis in a number of frequency bands, with the modulation analysis being undertaken in each channel. The suppression of unwanted noise occurs by attenuating the signal in those channels in which the modulation analysis detects a high noise component.

A filter band analysis or filter band synthesis is preferably employed for the resolution of the input signals as well as for the merging of the frequency bands after the amplification. Instead, a Fourier analysis or wavelet analysis can be implemented.

Instead of the modulation frequency analysis, some other signal analysis that can likewise be employed for the adaptive variation of the dynamics compression can be used such as, for example, a cepstral analysis or a short-term spectral analysis (time-frequency analysis). The time-frequency patterns acquired with the last-cited short-term spectral analysis can be employed for the classification of the acoustic signals.

In addition to the adaptive modification of the parameters of the AGC circuit on the basis of the signal analysis, a manual variation of the parameters by the hearing aid wearer can also inventively ensue with values being changed over a continuous range or in steps.

The invention is particularly suited for the use of digital signal processing, however, it can also be realized in the framework of analog signal processing.

The inventive circuit includes a signal analysis module that is connected to the input signal path and to a level detector and/or to an AGC amplification element.

In view of the signal analysis that is undertaken, the signal analysis module—for varying the dynamics compression—effects a variation of the time constant in the level detector or a modification of the gain characteristic of the AGC amplification element, ideally a modification of both values.

A delay element can be arranged in the input signal path for the compensation of signal transit times in the calculation of the gain value.

DESCRIPTION OF THE PREFERRED EMBODIMENTS

Figure 1:
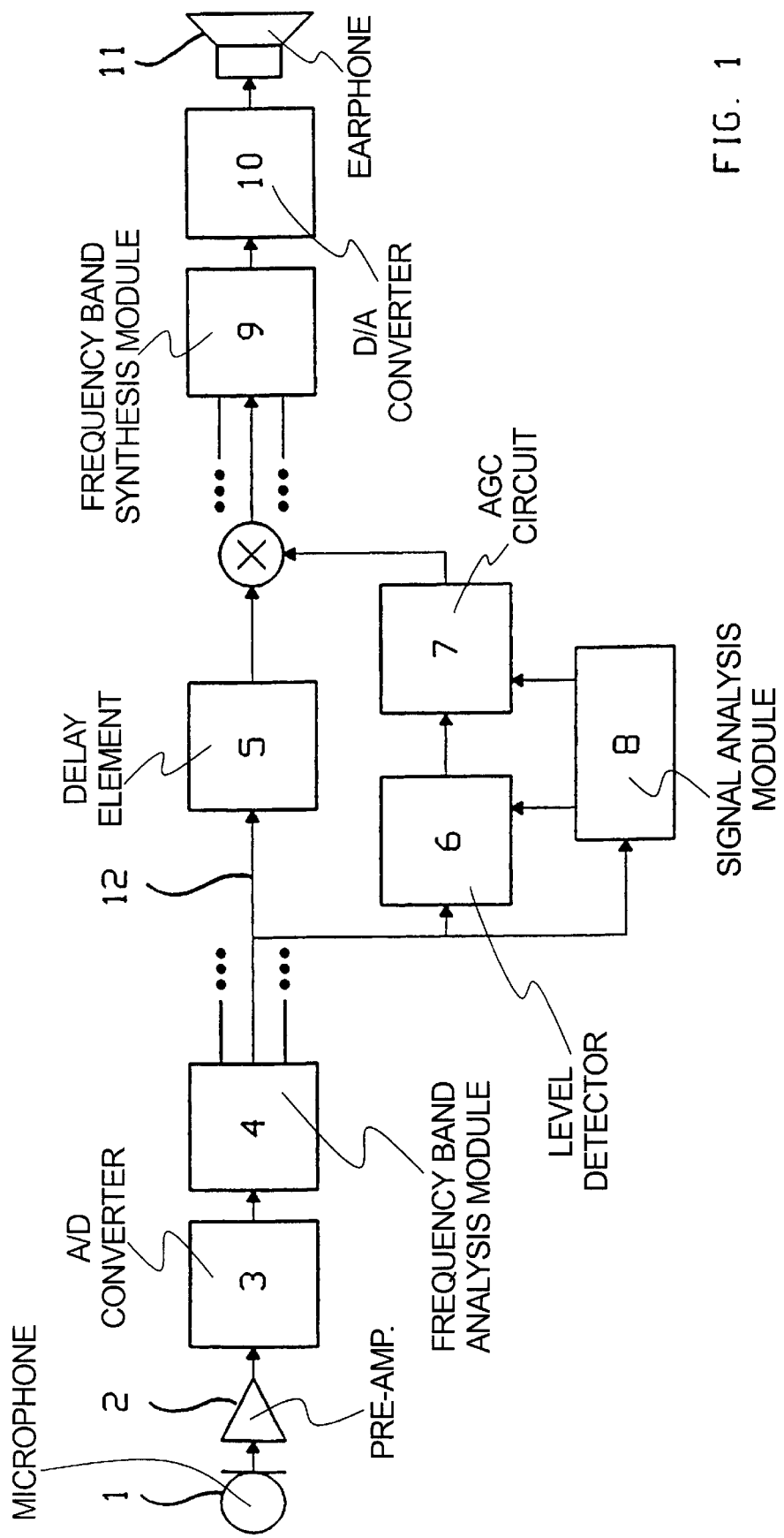
FIG. 1 is a simplified block diagram of the signal path in a hearing aid for the realization of the inventive method.

As shown in FIG. 1, the signal path has a microphone 1 for the pick-up of acoustic signals. The microphone 1 is in communication with a pre-amplifier 2.

The signals generated by the microphone 1 and amplified by the pre-amplifier 2 enter into an A/D converter 3 and are supplied to a frequency band analysis module 4 in digital form. A resolution of the digitized input signals into N individual frequency bands ensues therein.

The inventive circuit further includes a level detector 6 with variable time constants as well as an AGC amplification element 7 connected to the level detector 6.

A signal analysis module 8 for modulation frequency acquisition of a specific frequency band is additionally provided in the input signal path 12. The signal path can include a delay element 5 that can be connected in parallel across the level detector 6 and the AGC amplification element 7.

The arrangement of signal analysis module 8, delay element 5, level detector 6 as well as AGC amplification element 7 is allocated to each individual frequency band as circuit unit. For clarity, however, comparable circuit components of other frequency bands are not shown. Accordingly, the modulation frequency analysis is undertaken for each frequency band individually. As needed, various frequency bands can also be combined for the analysis and the dynamics compression can be varied on the basis of the analysis results. It is also possible to allocate the signal analysis module to only one frequency band and to employ the analysis results for the control of the AGC parameters of all frequency bands.

Subsequently, the signals of individual frequency bands are recombined via a frequency band synthesis module 9, are converted in a D/A/ converter 10 and are made audible by an earphone 11. For dynamics compression, the level of the input signals is acquired in the level detector 6 and the required amplification of the AGC amplification element 7 is determined on the basis of the measured level. Inventively, the behavior of the dynamics compression is adaptively varied with the signal analysis module 8. A modulation frequency analysis is implemented in the signal analysis module 8, the results thereof leading to a variation of the time constants in the level detector 6 and/or to a modification of the compression ratio, i.e. of the amplification value in the AGC amplification element 7. For example, long time constants and/or high compression ratios can be prescribed at low modulation frequencies, i.e. slowly varying signals, whereas short time constants and/or low compression ratios are prescribed at high modulation frequencies, i.e. quickly varying signals.

Other combinations of time constants and compression ratios can also be utilized. Instead of modulation frequency analysis, other signal analysis methods are also conceivable for the use of the adaptive variation of the dynamics compression such as, for example, cepstral analysis or a short-term spectral analysis.

Instead of the frequency band analysis for the resolution of the input signals into n frequency bands, a Fourier analysis or wavelet analysis can be undertaken.

The parameters of the AGC amplification element 7 itself are adaptively varied on the basis of the signal analysis and can be additionally varied, for example by the hearing aid wearer over a continuous range of values with the assistance of a standard volume control (not shown) or in steps with the assistance of a program button (not shown).

Instead of the described digital realization of the adaptive variation of the dynamics compression, the signal processing can ensue in analog form.

Figure 2:
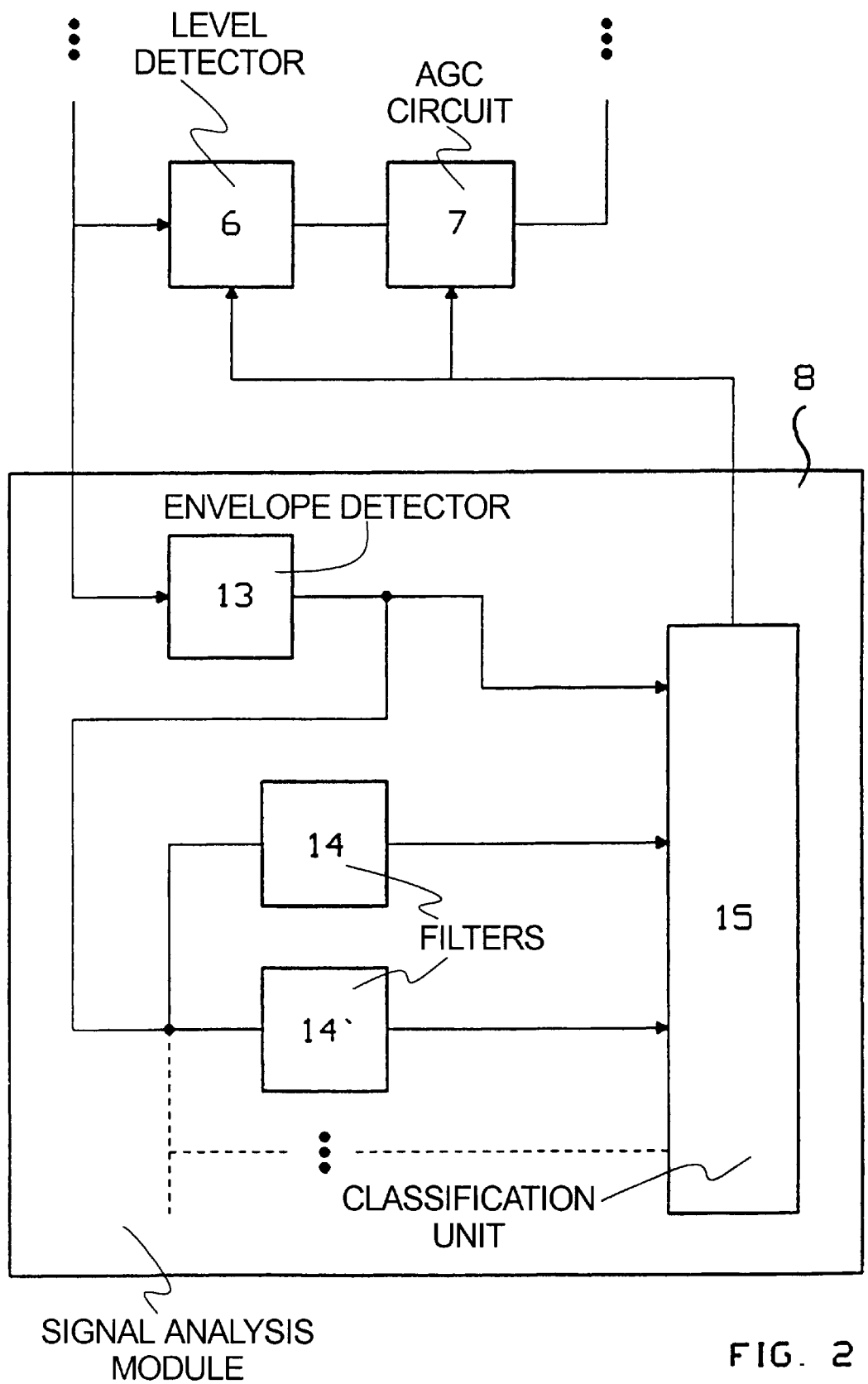
FIG. 2 is a block diagram of an embodiment of the signal analysis module in the hearing aid of FIG. 1 constructed and operating in accordance with the invention.

FIG. 2 shows an embodiment of the signal analysis module 8. The signal analysis module 8 has an envelope detector 13, a modulation filter bank, as well as a classification unit 15. For example, the modulation filter bank can be designed as two-channel filter bank composed of filters 14 and 14'. The modulation filters 14 and 14' are employed for determining the power in the respective modulation frequency ranges. The classification unit 15 evaluates the envelope detected by the detector 13 and the measured power respectively at the outputs of the modulation filters 14 and 14' and converts the results into AGC parameters (for control of the level detector 6 and of the AGC amplification element 7).

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for amplifying an input signal of a hearing aid comprising the steps of:
    supplying a hearing aid input signal, having a signal level and a modulation frequency, to an automatic gain control circuit having processing parameters associated therewith;
    conducting an analysis of said modulation frequency of said input signal wherein at least one characteristic of said input signal other than said signal level is analyzed, said signal analysis producing an analysis result including a classification of said input signal;

dependent on said analysis of said modulation frequency, classifying an environment of said input signal and classifying whether said input signal represents speech or non-speech; and dynamically compressing said input signal in said automatic gain control circuit by selecting said processing parameters dependent on said signal level and on said classification.

2. A method as claimed in claim 1 comprising the step of identifying said signal level of said input signal by supplying said input signal to a level detector having a time constant, and said method comprising the additional step of varying the dynamic compression of said input signal by modifying said time constant.

3. A method as claimed in claim 1 wherein said dynamic compression of said input signal has a compression ratio associated therewith, and comprising the additional step of varying the dynamic compression of said input signal by modifying said compression ratio.

4. A method as claimed in claim 1 comprising the additional step of dividing said input signal into a plurality of frequency bands, and wherein the step of conducting said signal analysis comprises conducting a signal analysis of said input signal dependent on said frequency bands.

5. A method as claimed in claim 4 wherein the step of conducting said signal analysis of said input signal dependent on said frequency bands comprises conducting a signal analysis in each of said plurality of frequency bands.

6. A method as claimed in claim 4 wherein the step of conducting a signal analysis of said input signal dependent on said frequency bands comprises conducting a signal analysis of said input signal in selected ones of said frequency bands.

7. A method as claimed in claim 4 wherein the step of conducting said signal analysis of said input signal dependent on said frequency bands comprises combining selected ones of said frequency bands to obtain combined frequency bands, and conducting a signal analysis of said input signal in said combined frequency band.

8. A method as claimed in claim 4 wherein the step of conducting said signal analysis of said input signal dependent on said frequency bands produces a plurality of signal analysis results, and comprising the additional step of combining said plurality of signal analysis results to produce said signal analysis result.

9. A method as claimed in claim 4 wherein the step of dividing said input signal into a plurality of frequency bands comprises supplying said input signal to a filter bank having a plurality of filters therein, said filters operating at different frequencies, and wherein said signal analysis produces a plurality of signal analysis results respectively at said different frequencies, and comprising the additional step of combining said plurality of signal analysis results by filter band synthesis.

10. A method as claimed in claim 4 wherein the step of dividing said input signal into a plurality of frequency bands comprises supplying said input signal to a filter bank having a plurality of filters therein, said filters operating at different frequencies, and wherein said signal analysis produces a plurality of signal analysis results respectively at said different frequencies, and comprising the additional step of combining said plurality of signal analysis results by filter band synthesis.

11. A method as claimed in claim 4 wherein the step of conducting a signal analysis of said input signal dependent on said frequency bands comprises conducting a modulation frequency analysis of the input signal in said frequency bands and identifying any of said frequency bands in which a predetermined noise level exists, and comprising the additional step of attenuating said input signal in any of said frequency bands in which said predetermined noise level exists.

12. A method as claimed in claim 1 wherein said automatic gain control circuit has at least one variable parameter associated therewith, and comprising the additional step of manually varying said at least one parameter within a continuous variation range.

13. A method as claimed in claim 1 wherein said automatic gain control circuit has at least one variable parameter, and comprising the additional step of manually varying said at least one variable parameter in steps.

14. A method as claimed in claim 1 wherein the step of dynamically compressing said input signal comprises digitally dynamically compressing said input signal.

15. A method as claimed in claim 1 wherein the step of dynamically compressing said input signal comprises conducting an analog dynamic compression of said input signal.

16. In a hearing aid having an acoustoelectrical transducer which produces an input signal having a modulation frequency and an electroacoustical transducer which produces an output signal and a signal path between said acoustoelectrical transducer and said electroacoustical transducer, the improvement comprising a circuit for amplifying said input signal in said signal path comprising:

a level detector, supplied with said input signal, which detects a level of said input signal and produces a level detector output;

a signal analysis module, supplied with said input signal, which conducts an analysis of said modulation frequency of said input signal and which produces an analysis result, said signal analysis module classifying an environment of said input signal dependent on said modulation frequency and classifying whether said input signal represents speech or non-speech, and said signal analysis result including a classification of said input signal obtained from said signal analysis dependent on said modulation frequency;

an automatic gain control circuit having processing parameters associated therewith, supplied with said level detector output and said signal analysis result, for dynamically compressing said input signal by setting said processing parameters dependent on said level detector output and said signal analysis result.

17. The improvement of claim 16 wherein said level detector has a time constant associated therewith, and wherein said signal analysis module comprises means for modifying said time constant of said level detector.

18. The improvement of claim 16 wherein said automatic gain control circuit has an amplification factor associated therewith, and wherein said signal analysis module comprises means for modifying said amplification factor.

19. The improvement of claim 16 further comprising a delay element connected in said signal path in parallel with said signal analysis module.

20. The improvement of claim 16 further comprising means in said signal path for dividing said input signal into a plurality of frequency bands before said input signal is supplied to said level detector and to said signal analysis module, and a filter band synthesis module connected in said signal path following said automatic gain control circuit.

* * * * *